United States Patent
Sasho et al.

(10) Patent No.: US 6,741,127 B2
(45) Date of Patent: May 25, 2004

(54) HIGH-FREQUENCY AMPLIFIER CIRCUIT AND RADIO COMMUNICATION APPARATUS USING SAME

(75) Inventors: Noboru Sasho, Kanagawa (JP); Shigeo Kusunoki, Kanagawa (JP); Masayoshi Abe, Tokyo (JP)

(73) Assignee: Sony Corporation (JP)

( * ) Notice: Subject to any disclaimer, the term of this patent is extended or adjusted under 35 U.S.C. 154(b) by 17 days.

(21) Appl. No.: 10/118,210

(22) Filed: Apr. 9, 2002

(65) Prior Publication Data
US 2002/0171481 A1 Nov. 21, 2002

(30) Foreign Application Priority Data
Apr. 16, 2001 (JP) .................................... P2001-116354

(51) Int. Cl.⁷ ................................................ H03G 3/20
(52) U.S. Cl. ...................................... 330/136; 330/285
(58) Field of Search .......................... 330/51, 136, 144, 330/285, 297

(56) References Cited

U.S. PATENT DOCUMENTS 4,409,559 A * 10/1983 Amada et al. .......... 330/392 X
5,101,172 A * 3/1992 Ikeda et al. .................. 330/136
5,142,240 A * 8/1992 Isota et al. .................... 330/149

* cited by examiner

*Primary Examiner*—Steven J. Mottola
(74) *Attorney, Agent, or Firm*—Rader, Fishman & Grauer PLLC

(57) ABSTRACT

In a high-frequency amplifier circuit, a power detector detects input power, an A/D converter converts the detection output into a digital signal, and then a digital LPF averages the digital signal to obtain data of the average value of input power level. Control data corresponding to the data of the average value is supplied as a control voltage from a DC-to-DC converter controlling memory to a DC-to-DC converter via a D/A means. Thus, a low output voltage vdd is supplied from the DC-to-DC converter to a power amplifier as circuit supply voltage of the power amplifier at the times of medium and low output power to control unnecessary current consumption by the power amplifier and thereby increase efficiency of the power amplifier at the times of medium and low output power.

12 Claims, 7 Drawing Sheets

HIGH-FREQUENCY AMPLIFIER CIRCUIT AND RADIO COMMUNICATION APPARATUS USING SAME

BACKGROUND OF THE INVENTION

The present invention relates to a high-frequency amplifier circuit and a radio communication apparatus using the same.

A radio communication apparatus, for example, a portable type radio communication apparatus typified by a portable telephone powered by a battery, requires a highly efficient high-frequency power amplifier in a transmitting system thereof to enable a long communication by the battery. Thus, various techniques have increased the efficiency of the high-frequency power amplifier.

On the other hand, a communication system such as CDMA (Code Division Multiple Access) controls the transmission output of a terminal over a very wide range, and therefore requires a power amplifier that is highly efficient over a wide output power range. However, although an ordinary power amplifier has a high efficiency around a maximum output power, the ordinary power amplifier often does not have a very high efficiency at the times of medium and low output power. This is because the efficiency at the times of medium and low output power can be improved by reducing bias current, but when the bias current is reduced too much, a specification regarding distortion at the time of high output power, for example, an adjacent-channel leakage power ratio, is not met.

The following three methods are conceivable as methods for improving the efficiency at the times of medium and low output power:

(A) To reduce the bias current at the time of no signal input as much as possible. However, when the value of the current is reduced too much, a great distortion occurs at the time of high output power, and therefore specifications regarding distortion (for example, the adjacent-channel leakage power ratio) cannot be met;

(B) To control the bias current of a control electrode of an amplifying device forming the power amplifier. Specifically, the bias current is reduced at the times of medium and low output power, and the bias current is increased at the time of high output power; and (C) To control the supply voltage of the power amplifier. Specifically, the supply voltage is reduced at the times of medium and low output power, and the supply voltage is increased at the time of high output power.

Letting Po be the high-frequency output power, Pi be input power, Ib be the direct-current bias current, and Vdd be the supply voltage, the power adding efficiency η of the power amplifier is given by the following equation:

$$\eta = (Po - Pi)/(Ib \times Vdd) \quad (1)$$

As is clear from the equation (1), the foregoing method (B) dynamically controls the direct-current bias current Ib of the denominator to increase thereby the efficiency, whereas the forgoing method (C) dynamically controls the supply voltage Vdd of the denominator to increase thereby the efficiency.

Known as the method (C), or a conventional technique for improving the efficiency at the times of medium and low output power by controlling the supply voltage supplied to the power amplifier, is a linear transmission apparatus described in Japanese Patent Laid-Open No. Hei 3-276912, for example. The linear transmission apparatus achieves high efficiency at the times of medium and low output power by controlling the supply voltage supplied to the power amplifier by the envelope signal level of an input modulated wave and controlling an input signal of the power amplifier by the difference between the envelope signal level of the input modulated wave and the envelope signal level of an output signal of the power amplifier.

However, since the conventional technique controls the supply voltage supplied to the power amplifier by analog signal processing, the conventional technique has a problem in that the characteristics with respect to temperature and device variations are degraded It is to be noted that in part of the embodiments of the conventional technique, a digital circuit is included in a control unit but not included in the power amplifier module, and a control signal is generated by a digital baseband unit for modulating a transmission signal; therefore, a current radio communication apparatus cannot obtain the effect of increasing the efficiency at the times of medium and low output power by replacing only the power amplifier module. Incidentally, it is generally difficult to change the specifications of a digital baseband IC afterward.

In addition, when the digital baseband unit controls the supply voltage supplied to the power amplifier, the characteristics of the power amplifier with respect to the supply voltage need to be prestored in the digital baseband unit. It is therefore very inconvenient when only the power amplifier is replaced, for example. Furthermore, in reality, it is rather difficult to know the characteristics of a power amplifier to be used in advance at the time of the manufacturing of a digital baseband unit.

SUMMARY OF THE INVENTION

The present invention has been made in view of the above problems, and it is accordingly an object of the present invention to provide a high-frequency amplifier circuit and a radio communication apparatus using the same that make it possible to realize all the control by digital processing within the power amplifier module.

According to the present invention, there is provided a high-frequency amplifier circuit comprising: a detecting means for detecting input power, an averaging means for averaging the detection output of the detecting means and outputting the averaged detection output as digital data; a DC-to-DC converting means for converting an externally supplied supply voltage into a predetermined direct-current voltage; a voltage controlling means for controlling the output voltage of the DC-to-DC converting means on the basis of the output data of the averaging means; and a power amplifier operated by the output voltage of the DC-to-DC converting means for amplifying an input signal and outputting the amplified input signal.

In the thus-comprised high-frequency amplifier circuit, the detecting means outputs an analog voltage value in accordance with the level of the input power. The analog voltage value is subjected to A/D conversion and then averaged (or averaged and then subjected to A/D conversion) by the averaging means. On the basis of data of the average value of the input power, the voltage controlling means controls the output voltage of the DC-to-DC converting means. Under this control, the DC-to-DC converting means converts the externally supplied supply voltage into a low voltage at the time of medium and low output power and into a high voltage at the time of high output power, and then supplies the low voltage and the high voltage to the power amplifier as circuit supply voltage of the power amplifier. Thus, by reducing the circuit supply voltage of the power amplifier at the times of medium and low output power consumption of a current unnecessarily flowing to the power amplifier can be controlled. Consequently, the efficiency at the times of medium and low output power is increased.

DETAILED DESCRIPTION OF PREFERRED EMBODIMENTS

Prefer embodiments of the present invention will hereinafter be described in detail with reference to the drawings.

First Embodiment

Figure 1:
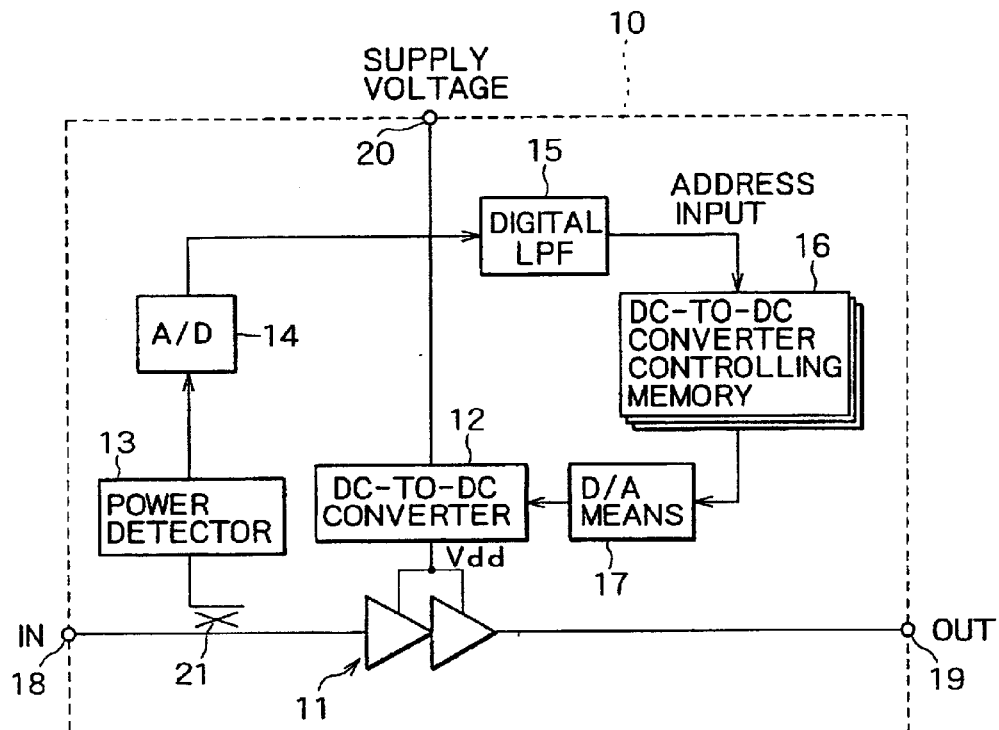
FIG. 1 is a block diagram showing a configuration of a high-frequency amplifier circuit according to a first embodiment of the present invention.

FIG. 1 is a block diagram showing a configuration of a high-frequency amplifier circuit according to a first embodiment of the present invention. The high-frequency amplifier circuit 10 according to the first embodiment in FIG. 1 includes a power amplifier 11, a DC-to-DC converter 12, a power detector 13, an A/D converter 14, a digital low-pass filter (LPF) 15, a DC-to-DC converter controlling memory 16, and a D/A means 17. The high-frequency amplifier circuit 10 has an input terminal 18, an output terminal 19, and a power supply terminal 20.

The power amplifier 11 operates using an output voltage Vdd of the DC-to-DC converter 12 as circuit supply voltage. The power amplifier 11 amplifies a high-frequency signal (input signal) externally supplied via the input terminal 18 and then outputs the result to the exterior thereof via the output terminal 19. At least part of the high-frequency signal inputted from the input terminal 18 is supplied to the power detector 13 via a directional coupler 21, for example.

The power detector 13 uses a nonlinear device formed by a diode or a transistor, for example. The power detector 13 rectifies the high-frequency signal, thereby detects the magnitude of an envelope of the high-frequency signal, and then outputs the detection output as an analog voltage value in accordance with the level of input power. The analog voltage value is converted into a digital signal indicating the level of the input power by the A/D converter 14 and then supplied to the digital LPF 15. The number of quantization bits required in the A/D conversion is determined by the fineness of voltage control.

The digital LPF 15 averages the digital signal. In the case of a linear modulation system as used in a portable type radio communication apparatus, such as a digital portable telephone, the envelope of the high-frequency signal varies at a speed of about a modulation symbol rate. Thus, the digital LPF 15 removes the varying component of the envelope and thereby obtains an average value of the input power (averaging). In this case, the cut-off frequency of the digital LPF 15 needs to be higher than the frequency of the variation of the envelope and sufficiently lower than the rate of transmitting power control.

The output data of the digital LPF 15, that is, the data of the average value of the input power the supplied as an address to the DC-to-DC converter controlling memory 16. Control data having values set such tat the supply voltage Vdd supplied from the DC-to-DC converter 12 to the power amplifier 11 has an optimum value for the input power are prestored as a control table in the DC-to-DC converter controlling memory 16. Both a RAM and a ROM may be used as the DC-to-DC converter controlling memory 16.

When the data of the average value of the input power are supplied as an address from the digital LPF 15, the DC-to-DC converter controlling memory 16 selects control data of a corresponding value from the prestored control table and then outputs the control data. The control data are converted into an analog control voltage by the D/A means 17 and then supplied to a control terminal of the DC-to-DC converter 12.

Figure 2:
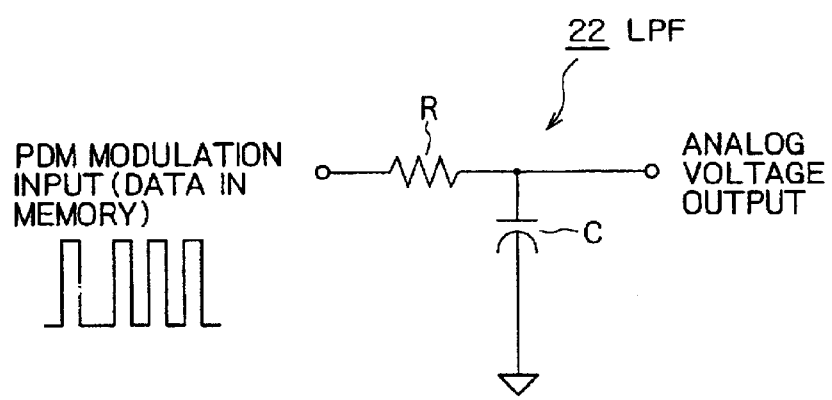
FIG. 2 is a circuit diagram showing an example of a configuration of a D/A means.

An ordinary D/A converter can be used as the D/A means 17. Since varying the rate of the control voltage is relatively slow, however, a simple configuration also can be employed in which an LPF 22 formed by a resistance R and a capacitor C, as shown in FIG. 2, is used in combination with PDM (Pulse Density Modulation) data supplied from the DC-to-DC converter controlling memory 16.

Figure 3:
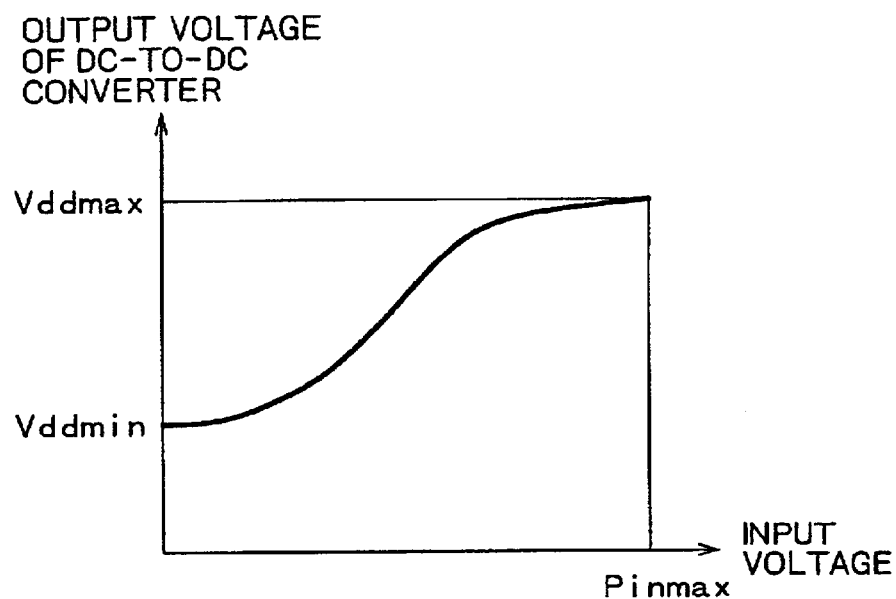
FIG. 3 is a diagram showing an example of characteristics of the output voltage Vdd of a DC-to-DC converter with reset to input power.

The DC-to-DC converter 12, whose control terminal is supplied with the control voltage from the D/A means 17, converts, as a DC-to-DC conversion, the supply voltage externally supplied via the power supply terminal 20 into an output voltage (direct-current voltage) Vdd corresponding to the control voltage and then outputs the output voltage Vdd. FIG. 3 shows an example of characteristics of the output voltage Vdd of the DC-to-DC converter 12 with respect to the input power. The output voltage Vdd of the DC-to-DC converter 12 is supplied to the power amplifier 11 as circuit power supply voltage for the power amplifier 11.

The circuit operation of the thus-formed high-frequency amplifier circuit 10 according to the first embodiment will be described next.

A high-frequency signal inputted from the input terminal 18 is supplied to the power amplifier 11, and also at least part of the high-frequency signal is supplied to the power detector 13 via the directional coupler 21. The power detector 13 detects the magnitude of an envelope of the high-frequency signal and thereby outputs an analog voltage value in accordance with the input power. The analog voltage value is converted into a digital signal by the A/D converter 14. The digital LPF 15 then averages the input power.

The input power is averaged by the digital LPF 15 for the following reason. As described above, in the case of a digital linear modulation system, the envelope of the high-frequency signal varies at a speed of about a modulation symbol rate. If following the variation of the envelope, the control voltage supplied to the DC-to-DC converter 12 varies. Thus, the digital LPF 15 is used to remove the varying component of the envelope and thereby obtain an average value of the input power.

Data of the average value of the input power are supplied to the DC-to-DC converter controlling memory 16 as an address thereof. When the data of the average value of the input power are supplied, the DC-to-DC converter controlling memory 16 selects control data having a value corresponding to the data of the average value of the input power from the prestored control table and then supplies the control data as control voltage to the DC-to-DC converter 12 via the D/A means 17.

When supplied with the control voltage, the DC-to-DC converter 12 converts the supply voltage externally supplied via the power supply terminal 20 into a direct-current voltage Vdd corresponding to the control voltage and then supplies the direct-current voltage Vdd to the power amplifier 11. The power amplifier 11 operates using the output voltage Vdd of the DC-to-DC converter 12 as its circuit supply voltage. The power amplifier 11 amplifies the power of the high-frequency signal inputted from the input terminal 18 and then outputs the result from the output terminal 19 to the exterior thereof.

As described above, the high-frequency amplifier circuit 10 according to the first embodiment detects the input power, obtains the data of the average value of the input power by averaging the detection output, and controls the circuit supply voltage supplied to the power amplifier 11 on the basis of the data of the average value, or specifically, reduces the output voltage Vdd of the DC-to-DC converter 12 at the times of medium and low output power, whereby consumption of an unnecessarily flowing current can be controlled. It is therefore possible to improve the power adding efficiency of the power amplifier 11 at the times of medium and low output power.

Figure 4:
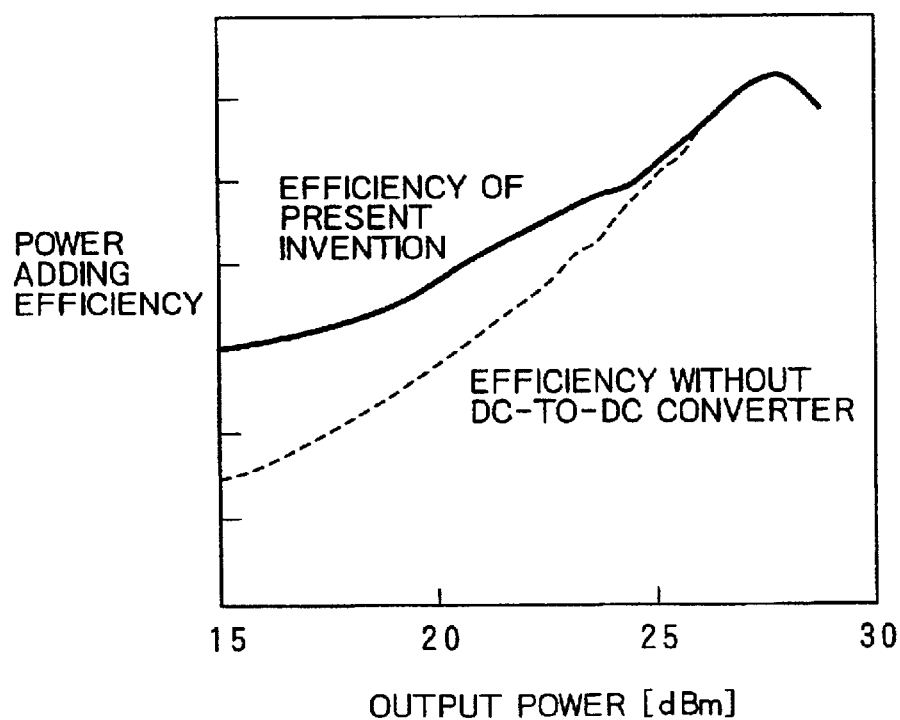
FIG. 4 is a diagram showing characteristics of the power adding efficiency of a power amplifier with respect to output power.

FIG. 4 shows characteristics of the power adding efficiency of the power amplifier 11 with respect to output power. In the figure, a broken line indicates a power adding efficiency with no DC-to-DC converter 12, while a solid line indicates power adding efficiency with the DC-to-DC converter 12, that is a power adding efficiency with the high-frequency amplifier circuit 10 according to the first embodiment. As is clear from the characteristic diagram, although the DC-to-DC converter 12 does not improve the efficiency around a maximum output power, the power adding efficiency in the case with the DC-to-DC converter 12 is greatly improved in a range of low output power to medium output power as compared with the case with no DC-to-DC converter 12.

In particular, since the control system for controlling the output voltage Vdd of the DC-to-DC converter 12 according to the input power is formed by a digital circuit, the characteristics of the control system with respect to temperature, secular change, or device variations are not readily degraded. In addition, since the whole of the control system is included in the high-frequency amplifier circuit 10, that is, in the power amplifier module, a current portable-type radio communication apparatus using a power amplifier module can obtain the effect of increasing the efficiency of the power amplifier 11 at the times of medium and low output power if only the power amplifier module is replaced.

Figure 5:
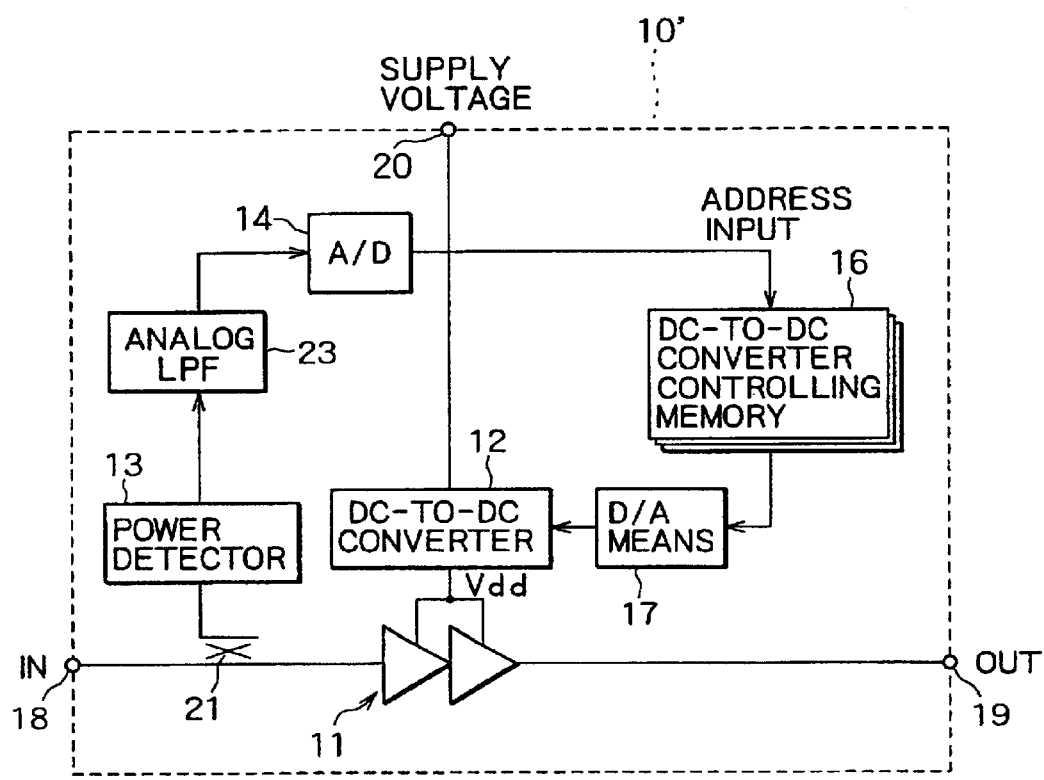
FIG. 5 is a block diagram showing a configuration of a high-frequency amplifier circuit according to a modification example of the first embodiment.

It is to be noted that while the high-frequency amplifier circuit 10 according to the first embodiment is configured to convert the detection output of the power detector 13 into a digital signal by means of the A/D converter 14 and then average the digital signal by means of the digital LPF 15, the order can be reversed. Specifically, as shown in FIG. 5, a high-frequency amplifier circuit 10' according to a modification of the first embodiment can be configured to average the detection output of the power detector 13 by means of an analog LPF 23 and then convert the result into a digital signal by means of the A/D converter 14.

Thus, since the high-frequency amplifier circuit 10' according to the modification obtains the average value of the input power in an analog signal stage before the A/D conversion, the high-frequency amplifier circuit 10' may require a much slower sampling rate of the A/D converter 14 than when the average value of the input power is obtained in a digital signal stage. Therefore, an inexpensive A/D converter may be used as the A/D converter 14. This results in an advantage of being able to form the high-frequency amplifier circuit 10' inexpensively.

Second Embodiment

Figure 6:
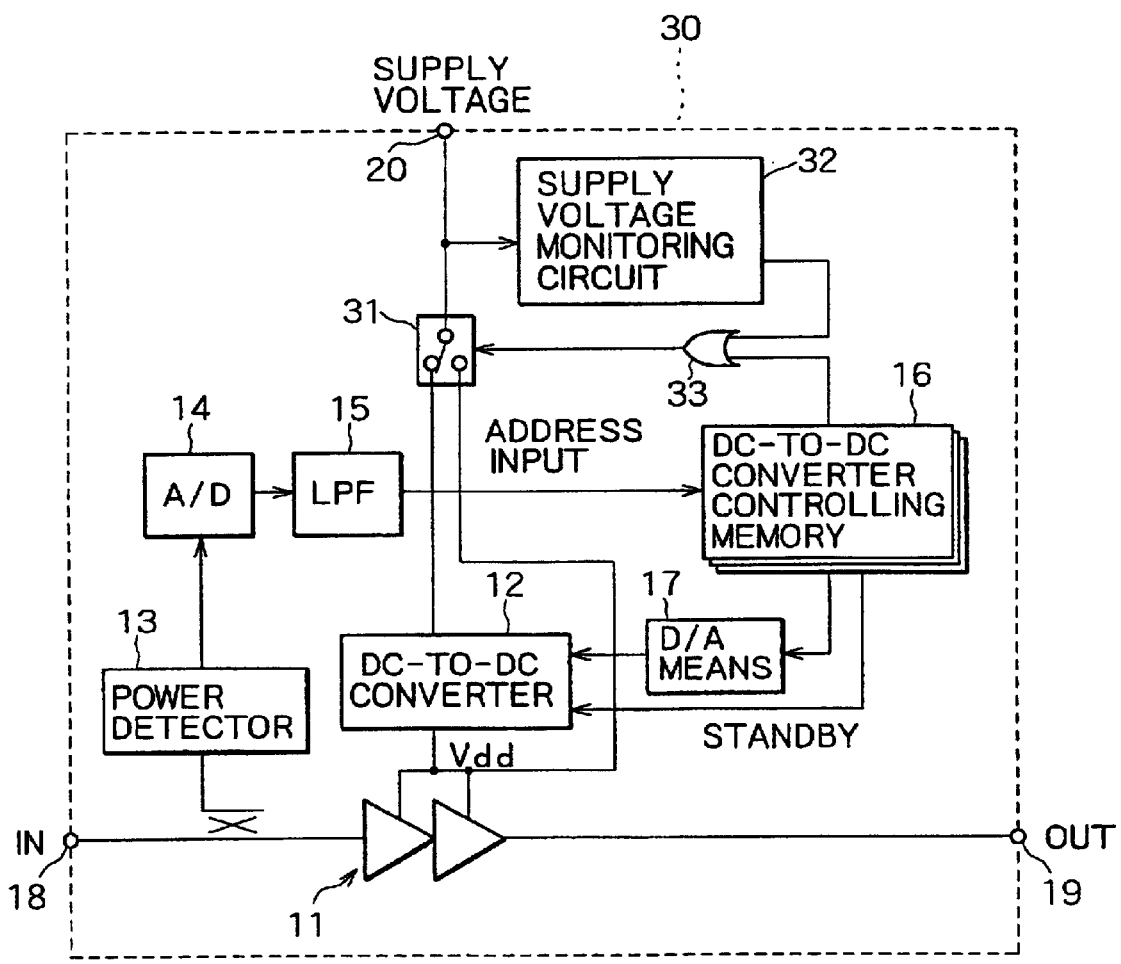
FIG. 6 is a block diagram showing a configuration of a high-frequency amplifier circuit according to a second embodiment of the present invention.

FIG. 6 is a block diagram showing a configuration of a high-frequency amplifier circuit according to a second embodiment of the present invention. In the figure, the same parts as in FIG. 1 are shown identified by the same reference numerals.

In FIG. 6, the high-frequency amplifier circuit 30 according to the second embodiment includes a selector switch 31, a supply voltage monitoring circuit 32, and an OR circuit 33 in addition to a power amplifier 11, a DC-to-DC converter 12, a power detector 13, an A/D converter 14, a digital LPF 15, a DC-to-DC converter controlling memory 16, and a D/A means 17. The high-frequency amplifier circuit 30 has an input terminal 18, an output terminal 19, and a power supply terminal 20.

The functions of the power amplifier 11, the DC-to-DC converter 12, the power detector 13, the A/D converter 14, the digital LPF 15, the DC-to-DC converter controlling memory 16, and the D/A means 17 are the same as in the first embodiment, and therefore their description will be omitted.

The selector switch 31 receives a supply voltage externally supplied via the power supply terminal 20 as input and alternatively supplies either one of the DC-to-DC converter 12 and the power amplifier 11 with the supply voltage. The supply voltage monitoring circuit 32 monitors the supply voltage externally supplied via the power supply terminal 20 and outputs a selection control signal when the supply voltage is so high as to exceed withstand voltage of the DC-to-DC converter 12.

During control of the output voltage Vdd of the DC-to-DC converter 12 on the basis of the average value of input power, the DC-to-DC converter controlling memory 16 outputs a selection control signal when a high voltage close to the supply voltage supplied from the power supply terminal 20 is to be set as the output voltage Vdd. The OR circuit 33 receives, as two inputs, the selection control signals outputted from the supply voltage monitoring circuit 32 and the DC-to-DC converter controlling memory 16 and supplies the selection control signals to the selector switch 31 to control thereby the selection of the selector switch 31.

The circuit operation of the thus-formed high-frequency amplifier circuit 30 according to the second embodiment will be described next.

First, during normal operation in which the supply voltage monitoring circuit 32 and the DC-to-DC converter controlling memory 16 do not output a selection control signal, the selector switch 31 is in a state of being turned to the DC-to-DC converter 12 side. In this state, as in the case of the circuit operation of the high-frequency amplifier circuit 10 according to the first embodiment, the high-frequency amplifier circuit 30 performs a circuit operation for obtaining data of the average value of the input power and then controlling the output voltage Vdd of the DC-to-DC converter 12, that is, the circuit-supply voltage of the power amplifier 11, on the basis of the data of the average value to increase thereby the efficiency of the power amplifier 11 at the times of medium and low output power.

When the supply voltage supplied from the power-supply terminal 20 is so high as to exceed the withstand voltage of the DC-to-DC converter 12, the supply voltage monitoring circuit 32 outputs a selection control signal, and when a high voltage close to the supply voltage is to be set as the output voltage Vdd of the DC-to-DC convener 12 on the basis of the average value of the input power, the DC-to-DC converter controlling memory 16 outputs a selection control signal. Then, by supplying the selection control signal to the selector switch 31 via the OR circuit 33, the selector switch 31 is turned to the power amplifier 11 side. In this state the supply voltage from the power supply terminal 20 bypasses the DC-to-DC converter 12 and is supplied directly to the power amplifier 11 as circuit supply voltage of the power amplifier 11.

The reason that the DC-to-DC converter 12 is bypassed when the supply voltage monitoring circuit 32 or the DC-to-DC converter controlling memory 16 outputs a selection control signal will be described in the following.

When the high-frequency amplifier circuit 30 asking to the second embodiment, that is, the power amplifier module, is used in a portable type radio communication apparatus typified by a portable telephone, output voltage of a secondary battery is generally supplied as a supply voltage to the power supply terminal 20. The secondary battery has the highest output voltage when fully charged and decreases the output voltage as the battery is used. In addition, while finer processes (for CMOS, for example) improve the performance of the DC-to-DC converter, such as conversion efficiency, year after year, the withstand voltage of the DC-to-DC converter is decreased with the improvement in performance. Hence, a high voltage applied to the power supply terminal may break down the DC-to-DC converter. The possibility of the breakdown becomes highest at the time of full charge, that is, when the supply voltage is highest.

In view of the above, in the high-frequency amplifier circuit 30 according to the second embodiment, the supply voltage monitoring circuit 32 outputs a selection control signal on detecting a state of the highest voltage at the time of full charge, or the DC-to-DC converter controlling memory 16 outputs a selection control signal when a high voltage close to the supply voltage supplied from the power supply terminal 20 is to be set as the output voltage Vdd of the DC-to-DC converter 12. The selection control signals turn the selector switch 31 to the side for bypassing the DC-to-DC converter 12.

With this configuration, when the high-frequency amplifier circuit 30 according to the second embodiment is used in a portable type radio communication apparatus, it is possible to prevent a high voltage exceeding the withstand voltage of the DC-to-DC convener 12 from being applied to the DC-to-DC converter 12 at the time of full charge of the secondary battery or the like, and accordingly it is possible to reliably protect the DC-to-DC converter 12 from a breakdown due to application of the high voltage. When the DC-to-DC converter 12 is bypassed, however, the operation for increased efficiency at the times of medium and low output power is not performed.

It is to be noted that, as in the case of the modification (see FIG. 5) of the high-frequency amplifier circuit 10 according to the first embodiment, the high-frequency amplifier circuit 30 according to the second embedment can be configured to average the detection output of the power detector 13 by means of an analog LPF 23 and then convert the result into a digital signal by means of the A/D converter 14.

Third Embodiment

Figure 7:
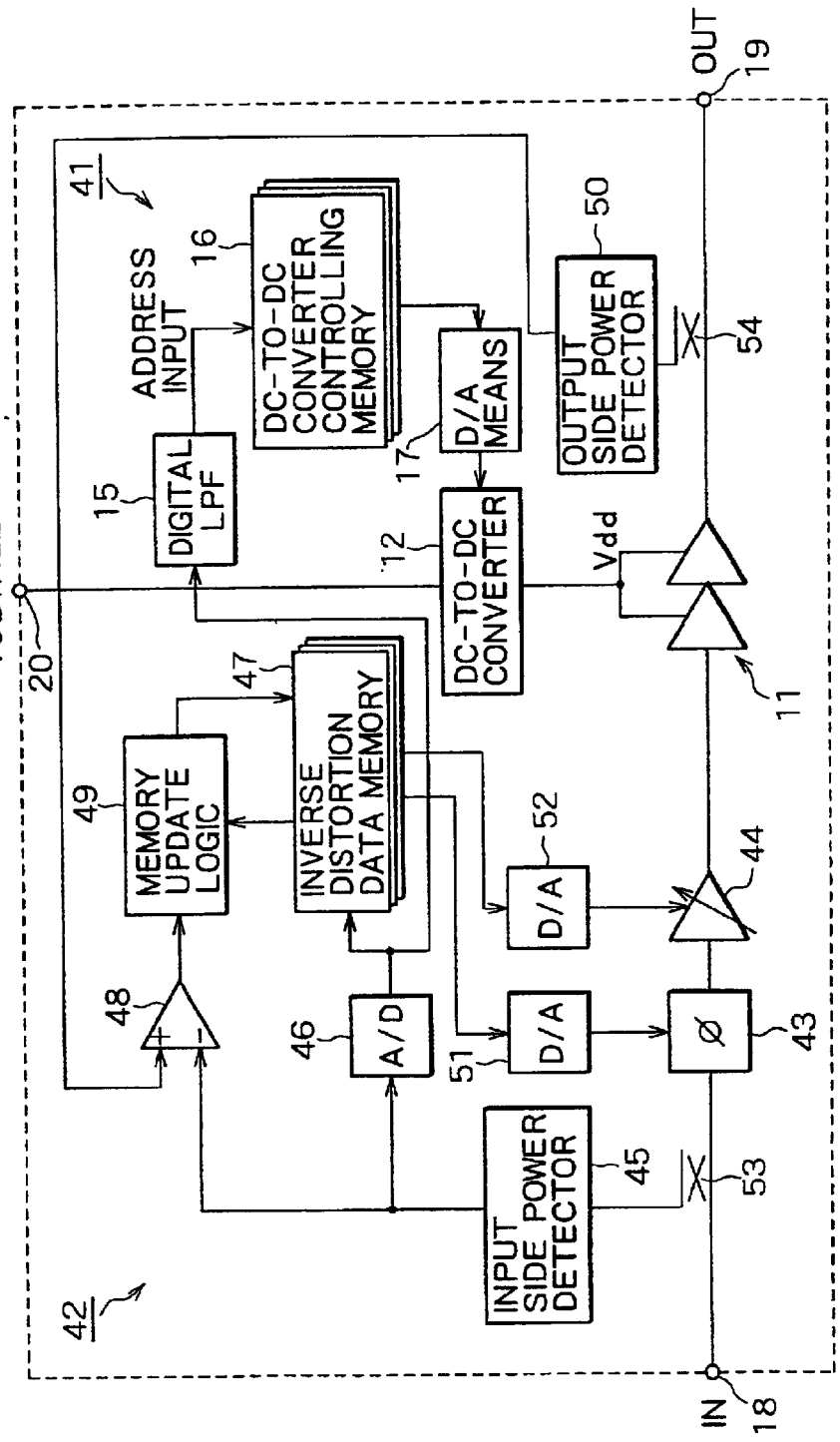
FIG. 7 is a block diagram showing a configuration of a high-frequency amplifier circuit according to a third embodiment of the present invention.

FIG. 7 is a block diagram showing a configuration of a high-frequency amplifier circuit according to a third (embodiment of the present invention. In the figure, the same parts as in FIG. 1 are shown identified by the same reference numerals.

In FIG. 7, the high-frequency amplifier circuit 40 according to the third embodiment includes a front-disposed distortion-compensating circuit portion (hereinafter referred to simply as a front-disposed distortion-compensating circuit) 42 for generating inverse distortion components of a power amplifier 11 on the basis of input power and thereby controlling the nonlinearity of the power amplifier 11, in addition to the circuit portion according to the first embodiment, that is, a circuit portion 41 for converting a supply voltage externally supplied via a power supply terminal 20 into a voltage Vdd in accordance with the average value of the input power and supplying the power amplifier 11 with the voltage Vdd as circuit supply voltage of the power amplifier 11. The high-frequency amplifier circuit 40 has an input terminal 18, an output terminal 19, and a power supply terminal 20.

The functions of components of the circuit portion 41 for converting the externally supplied supply voltage into the voltage Vdd in accordance with the average value of the input power and supplying the power amplifier 11 with the voltage Vdd, that is, a DC-to-DC converter 12, a digital LPF 15, a DC-to-DC converter controlling memory 16, and a D/A means 17, are the same as in the first embodiment, and therefore their description will be omitted.

It is to be noted that, as described later, an input side power detector and an A/D converter that form the front-disposed distortion-compensating circuit 42 are used also as a power detector 13 and an A/D converter 14, as shown in FIG. 1, among the components of the circuit portion 41 in the third embodiment. Of course, however, as in the case of the high-frequency amplifier circuit 10 according to the first embodiment, the power detector 13 and the A/D converter 14 may be provided specially and separately.

The front-disposed distortion-compensating circuit 42 is of a circuit configuration having a variable phase shifter 43, a variable gain unit 44, an input side power detector 45, an A/D converter 46, an inverse distortion data memory 47, a voltage comparator 48, a memory update logic 49, an output side power detector 50, and D/A converters 51 and 52. At least part of a high-frequency signal inputted from the input terminal 18 is supplied to the input side power detector 45 via a directional coupler 53, for example. Also, at least part of a high-frequency signal outputted from the power amplifier 11 is supplied to the output side power detector 50 via a directional coupler 54, for example.

The power detectors 45 and 50 use a nonlinear device formed by a diode or a transistor, for example. The power detectors 45 and 50 rectify the high-frequency signal to thereby detect the magnitude of an envelope of the high-frequency signal and then output the detection output as an analog voltage value in accordance with level of input power. The analog voltage value outputted from the input side power detector 45 is converted into a digital signal indicating the level of the input power by the A/D converter 46 and also supplied to the voltage comparator 48 as a negative input of the voltage comparator 48. The analog voltage value outputted from the output side power detector 50 is supplied to the voltage comparator 48 as a positive input of the voltage comparator 48.

The digital signal indicating the level of the input power, which signal is outputted from the A/D converter 46, is supplied to the digital LPF 15. Thus, as described above, the input side power detector 45 and the A/D converter 46 also serve as the power detector 13 and the A/D converter 14, respectively, in the high-frequency amplifier circuit 10 according to the first embodiment (see FIG. 1). Since the A/D converter 46 needs to respond to an input waveform instantaneously, quickness is required of the A/D converter 46. The number of quantization bits required in A/D conversion by the A/D converter 46 is determined by a modulated-wave bandwidth of the high-frequency signal and a required distortion compensation level.

The digital signal indicating the level of the input power, which signal is outputted from the A/D converter 46, is also supplied to the inverse distortion data memory 47 as an address of the inverse distortion data memory 47. Inverse distortion data obtained as inverse components of a phase component and an amplitude component obtained by separating an extracted distortion component of the power amplifier 11 am stored in the inverse distortion data memory 47 as a control table in advance during manufacturing When the digital signal indicating the level of the input power is supplied as an address from the A/D converter 46, the inverse distortion data memory 47 outputs inverse distortion data, that is, inverse phase component data and inverse amplitude component data corresponding to the address (input power level) from the prestored control table. The inverse phase component data are converted into an analog signal by the D/A converter 51 and then supplied to the variable phase shifter 43. The inverse amplitude component is converted into an analog signal by the D/A converter 52 and then supplied to the variable gain unit 44.

The variable phase shifter 43 adjusts the phase of the high-frequency signal inputted from the input terminal 18 on the basis of the inverse phase component. The variable gain unit 44 adjusts the gain of the high-frequency signal adjusted in phase by the variable phase shifter 43, on the basis of the inverse amplitude component, and then supplies the result to the power amplifier 11. The phase adjustment of the variable phase shifter 43 and the gain adjustment (amplitude adjustment) of the variable gain unit 44 compensate for nonlinear distortion occurring in the power amplifier 11.

The voltage comparator 48 compares the analog voltage value outputted from the input side power detector 45 and the analog voltage value outputted from the output side power detector 50 with each other and then supplies the result of the comparison to the memory update logic 49. When some factor, such as temperature or secular change, causes the prestored data of the inverse distortion component of the power amplifier 11 to differ from an actual distortion component, a voltage difference corresponding to the difference is obtained by the voltage comparator 48. The memory update logic 49 corrects (updates) the prestored data of the inversedistortion component of the power amplifier 11 by readdressing the control table stored in the inverse distortion data memory 47 on the basis of the result of the comparison of the voltage comparator 48.

The circuit operation of the thus-formed high-frequency amplifier circuit 40 according to the third embodiment will next be described.

Most of a high-frequency signal inputted from the input terminal 18 is supplied to the variable phase shifter 43, and part of the high-frequency signal is supplied to the input side power detector 45 via the directional coupler 53. The input side power detector 45 detects the magnitude of an envelope of the high-frequency signal, and thereby outputs an analog voltage value in accordance with the input power. The analog voltage value is converted into a digital signal by the A/D converter 46. The digital signal is supplied to the inverse distortion data memory 47 as an address of the inverse distortion data memory 47, also is averaged by the digital LPF 15 and then supplied to the DC-to-DC converter controlling memory 16 as an address of the DC-to-DC converter controlling memory 16.

The circuit operation of the circuit portion 41, that is, the circuit operation for obtaining data of the average value of the input power, by means of the digital LPF 15 and then changing the circuit supply voltage of the power amplifier 11 by controlling the output voltage Vdd of the DC-to-DC converter 12 on the basis of the data of the average value to thereby increase the efficiency of the power amplifier 11 at the times of medium and low output power is the same as the circuit operation of the high-frequency amplifier circuit 10 according to the first embodiment. A detailed description of the circuit operation will therefore be omitted.

In the meantime, in the front-disposed distortion-compensating circuit 42, the A/D converter 46 converts the analog voltage value corresponding to the input power into a digital signal and then supplies the inverse distortion data memory 47 with the digital signal as an address of the inverse distortion data memory 47. The inverse distortion data memory 47 thereby supplies data of an inverse phase component and an inverse amplitude component corresponding to the level of the input power from the prestored control table to the variable phase shifter 43 and the variable gain unit 44 via the D/A converters 51 and 52, respectively. Thus, the variable phase shifter 43 and the variable gain unit 44 make a phase adjustment and a gain adjustment to the high-frequency signal inputted from the input terminal 18 on the basis of the inverse phase component and the inverse amplitude component, respectively. As a result, nonlinear distortion occurring in the power amplifier 11 is compensated for.

Also, the voltage comparator 48 compares the analog voltage value outputted from the input side power detector 45 and the analog voltage value outputted from the output side power detector 50 with each other. On the basis of the result of the comparison, the memory update logic 49 updates the inverse distortion data memory 47. With this feedback control, even when some factor, such as temperature or secular change, causes the prestored data of the inverse distortion component of the power amplifier 11 to differ from an actual distortion component, the control table stored in the inverse distortion data memory 47 is updated, and thus an optimum inverse distortion component is added to the input signal (high-frequency signal) at all times. Therefore, nonlinear distortion occurring in the power amplifier 11 is compensated for more reliably.

Thus, the front-disposed distortion-compensating circuit 42 retains in advance the inverse distortion components of the phase component and the amplitude component obtained by separating the distortion component of the power amplifier 11 in the inverse distortion data memory 47, whereas the front-disposed distortion-compensating circuit 42 detects the input power by means of the power detector 45, obtains inverse distortion components corresponding to the level of the input power from the inverse distortion data memory 47, and then adds the inverse distortion components to the input signal on the input side of the power amplifier 11, whereby nonlinear distortion occurring in the power amplifier 11 can be compensated for. It is therefore possible to improve the power adding efficiency of the power amplifier 11.

However, in the case of the front-disposed distortion-compensating circuit 42, when the input power is decreased to a few mW or less, which falls into a linear region, the effect of distortion compensation is not obtained. Thus, the front-disposed distortion-compensating circuit 42 effectively functions for efficiency improvement at the time of high output power, especially around a maximum output power. In a case where the high-frequency amplifier circuit 40 according to the third embodiment is used in a portable telephone, for example, since a portable telephone has a maximum output of about 1 W, the high output power represents an output range of about 500 mW and over.

As described above, the high-frequency amplifier circuit 40 according to the third embodiment is not only able to improve the power adding efficiency of the power amplifier 11 at the times of medium mad low output power by the effect of the circuit portion 41 for controlling the output voltage Vdd of the DC-to-DC converter 12 according to the average value of the input power, but it is also able to improve the power adding efficiency of the power amplifier 11 at the time of high output power by the effect of the front-disposed distortion-compensating circuit 42 for generating the inverse distortion components of the power amplifier 11 on the basis of the input power and thereby controlling the nonlinearity of the power amplifier 11. The high-frequency amplifier circuit 40 can therefore operate at high efficiency over a wide input dynamic range.

In addition, the high-frequency amplifier circuit 40 according to the third embodiment utilizes the input side power detector 45 and the A/D converter 46 forming the front-disposed distortion-compensating circuit 42 also as the power detector and the A/D converter (the power detector 13 and the A/D converter 14 in FIG. 1) used in the circuit portion 41 for controlling the output voltage Vdd of the DC-to-DC converter 12 according to the average value of the input power. Therefore, the circuit configuration of the high-frequency amplifier circuit 40 can be correspondingly simplified, and also the high-frequency amplifier circuit 40 can be realized at a low cost.

Fourth Embodiment

Figure 8:
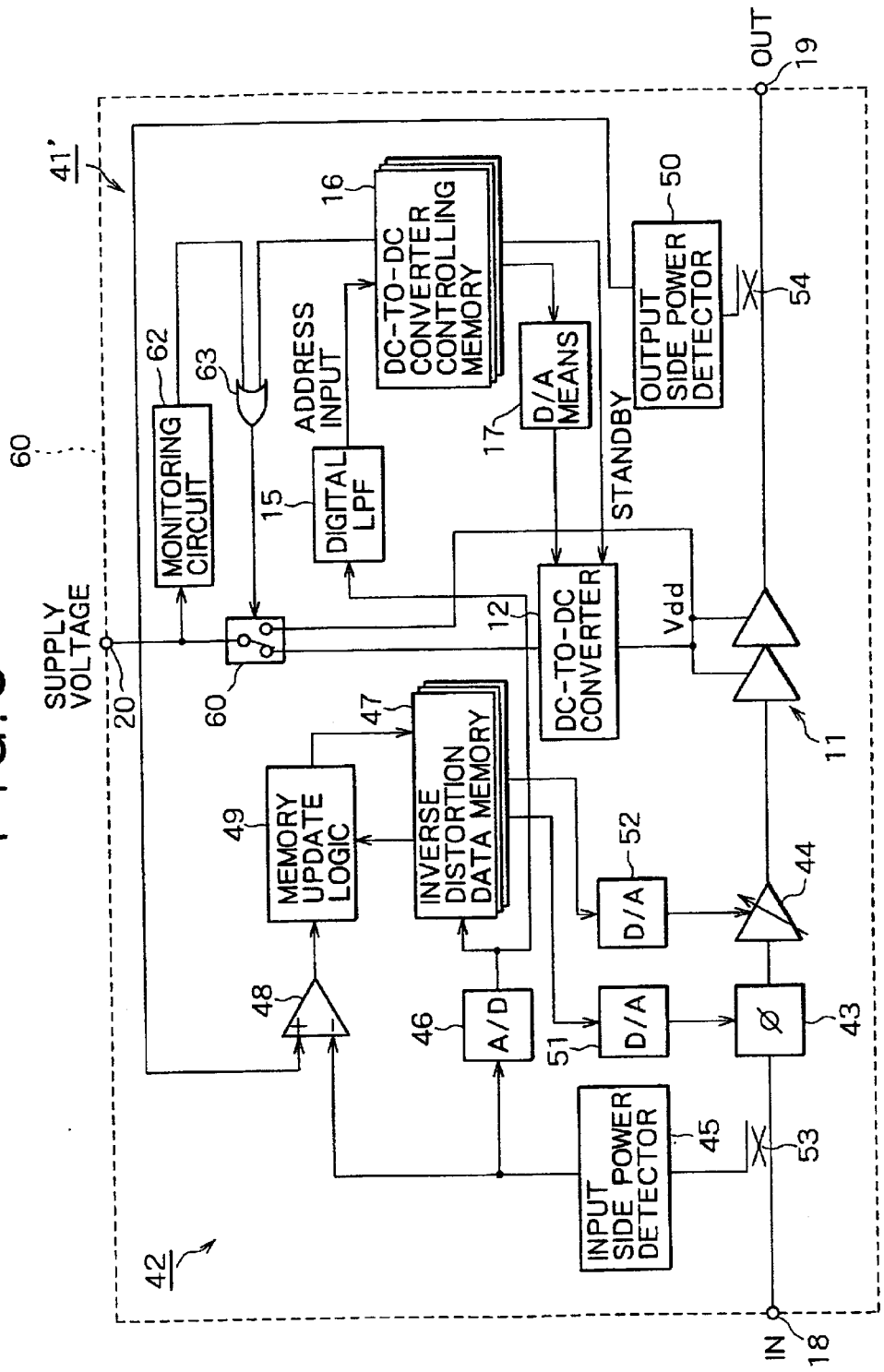
FIG. 8 is a block diagram showing a configuration of a high-frequency amplifier circuit according to a fourth embodiment of the present invention.

FIG. 8 is a block diagram showing a configuration of a high-frequency amplifier circuit according to a fourth embodiment of the present invention. In the figure, the same parts as in FIG. 7 are shown identified by the same reference numerals.

In the high-frequency amplifier circuit 60 according to the fourth embodiment in FIG. 8, a circuit portion 41' for converting a supply voltage externally supplied via a power supply terminal 20 into a voltage Vdd in accordance with the average value of input power and supplying a power amplifier 11 with the voltage Vdd has a selector switch 61, a supply voltage monitoring circuit 62, and an OR circuit 63, in addition to a DC-to-DC converter 12, a digital LPF 15, a DC-to-DC converter controlling memory 16, and a D/A means 17.

A front-disposed distortion-compensating circuit 42 is possessed by the high-frequency amplifier circuit 60 according to the fourth embodiment; and the functions of components of the front-disposed distortion-compensating circuit 42, that is, a variable phase shifter 43, a variable gain unit 44, an input side power detector 45, an A/D converter 46, an inverse distortion data memory 47, a voltage comparator 48, a memory update logic 49, an output side power detector 50, and D/A conveners 51 and 52, are the same as in the third embodiment. Thus, a description of the front-disposed distortion-compensating circuit 42 and the functions of the components of the front-disposed distortion-compensating circuit 42 will be omitted.

The selector switch 61 receives the supply voltage externally supplied via the power supply terminal 20 as input and alternatively supplies either one of the DC-to-DC converter 12 and the power amplifier 11 with the supply voltage. The supply voltage monitoring circuit 62 monitors the supply voltage externally supplied via the power supply terminal 20 and outputs a selection control signal when the supply voltage is so high as to exceed the withstand voltage of the DC-to-DC converter 12.

During control of the output voltage Vdd of the DC-to-DC converter 12 on the basis of the average value of input power, the DC-to-DC converter controlling memory 16 outputs a selection control signal when a high voltage close to the supply voltage supplied from the power supply terminal 20 is to be set as the output voltage Vdd. The OR circuit 63 receives, as two inputs, the selection control signals outputted from the supply voltage monitoring circuit 62 and the DC-to-DC converter controlling memory 16 and supplies the selection control signals to the selector switch 61 to thereby control the selection of the selector switch 61.

Thus, the functions of the selector switch 61, the supply voltage monitoring circuit 62, and the OR circuit 63 in the high-frequency amplifier circuit 60 according to the fourth embodiment are basically the same as the functions of the selector switch 31, the supply voltage monitoring circuit 32, and the OR circuit 33 in the high-frequency amplifier circuit 30 according to the second embodiment.

The circuit operation of the thus formed high-frequency amplifier circuit 60 according to the fourth embodiment will next be described. The circuit operation of the front-disposed distortion-compensating circuit 42 is exactly the same as in the high-frequency amplifier circuit 40 according to the third embodiment, and therefore a description of the circuit operation of the front-disposed distortion-compensating circuit 42 will be omitted.

First, during a normal operation in which the supply voltage monitoring circuit 62 and the DC-to-DC converter controlling memory 16 do not output a selection control signal, the selector switch 61 is in a state of being turned to the DC-to-DC converter 12 side. In this state, as in the case of the circuit operation of the high-frequency amplifier circuit 10 according to the first embodiment, the high-frequency amplifier circuit 60 performs a circuit operation for obtaining data of the average value of the input power and then controlling the output voltage Vdd of the DC-to-DC converter 12, that is, the circuit supply voltage of the power amplifier 11 on the basis of the data of the average value, to thereby increase the efficiency of the power amplifier 11 at the times of medium and low output power.

When the supply voltage supplied from the power supply terminal 20 is so high as to exceed the withstand voltage of the DC-to-DC converter 12, the supply voltage monitoring circuit 62 outputs a selection control signal, and when a high voltage close to the supply voltage is to be set as the output voltage Vdd of the DC-to-DC converter 12 on the basis of the average value of the input power, the DC-to-DC converter controlling memory 16 outputs a selection control signal. Then, by supplying the selection control signals to the selector switch 61 via the OR circuit 63, the selector switch 61 is turned to the power amplifier 11 side. In this state, the supply voltage from the power supply terminal 20 bypasses the DC-to-DC converter 12 and is supplied directly to the power amplifier 11 as circuit supply voltage of the power amplifier 11.

The reasons why the DC-to-DC converter 12 is bypassed when the supply voltage monitoring circuit 62 or the DC-to-DC converter controlling memory 16 outputs a selection control signal will be described in the following.

One of the reasons has been mentioned in the description of the high-frequency amplifier circuit 30 according to the second embodiment. Thus, when the high-frequency amplifier circuit 60 according to the fourth embodiment is used in a portable type radio communication apparatus, by detecting the state of the highest voltage at the time of full charge of the secondary battery by means of the supply voltage monitoring circuit 62, outputting a selection control signal, and thereby turning the selector switch 61 to the side for bypassing the DC-to-DC converter 12, it is possible to prevent a high voltage exceeding the withstand voltage of the DC-to-DC converter 12 from being applied to the DC-to-DC converter 12, and accordingly it is possible to protect reliably the DC-to-DC converter 12 from a breakdown due to application of the high voltage.

Another reason is that the conversion efficiency of the DC-to-DC converter 12 around a maximum output power is not 100%. Thus, during control of the output voltage Vdd of the DC-to-DC converter 12 on the basis of the average value of the input power, the DC-to-DC converter controlling memory 16 outputs a selection control signal to turn the selector switch 61 to the side for bypassing the DC-to-DC converter 12 when a high voltage close to the supply voltage supplied from the power supply terminal 20 is to be set as the output voltage Vdd, that is, when the power amplifier 11 approaches the maximum output power.

It is thus possible to avoid a decrease in the efficiency of the high-frequency amplifier circuit 60 according to the fourth embodiment, that is, the whole of the power amplifier module, due to a loss in the conversion efficiency of the DC-to-DC converter 12. When the DC-to-DC converter controlling memory 16 outputs a selection control signal, the DC-to-DC converter controlling memory 16 sends a standby signal to the DC-to-DC converter 12. When the standby signal is supplied, the DC-to-DC converter 12 is brought into a standby state, whereby the DC-to-DC converter 12 does not consume power.

It is to be noted that in the high-frequency amplifier circuit 40 and the high-frequency amplifier circuit 60 according to the third embodiment and the fourth embodiment, the high-frequency amplifier circuit 10 and the high-frequency amplifier circuit 30 according to the first embodiment and the second embodiment are used as the circuit portions (supply voltage converting means) 41 and 41', respectively, for changing the externally supplied supply voltage to the direct-current voltage corresponding to the input power, however, when the supply voltage converting means is used only for operation at a high efficiency over a wide input dynamic range in combination with the front-disposed distortion-compensating circuit 42, the supply voltage converting means may be of any configuration as long as the supply voltage converting means is of a configuration capable of improving the power adding efficiency of the power amplifier 11 at the time of medium and low output power.

Application Example

Figure 9:
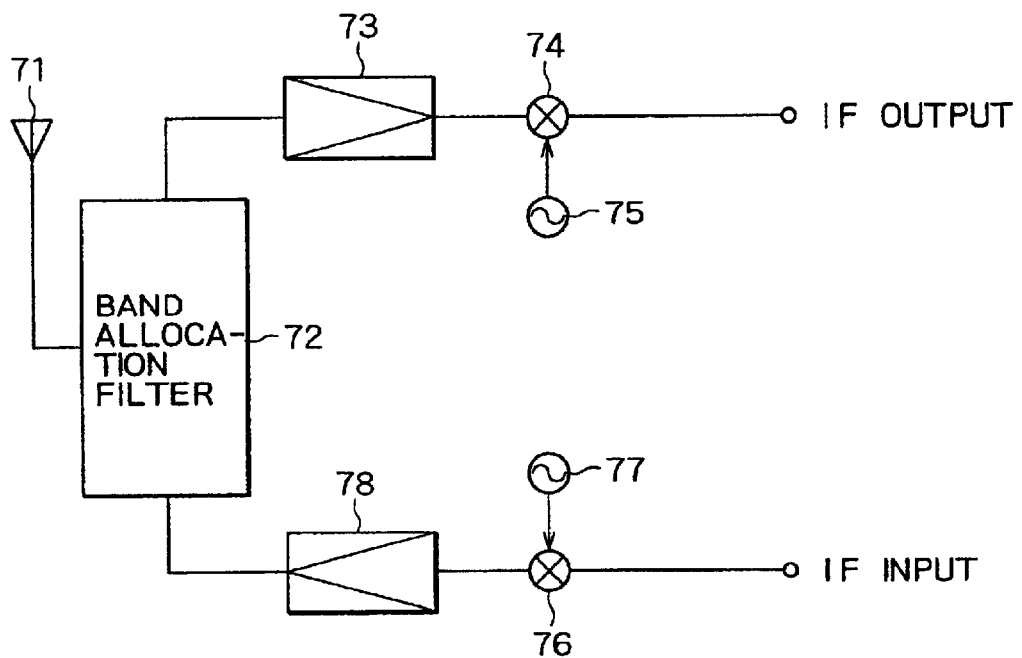
FIG. 9 is a block diagram showing an example of a configuration of an RF front end unit in a CDMA-type portable telephone.

The high-frequency amplifier circuit 10 according to the first embodiment, the high-frequency amplifier circuit 10' according to a modification of the first embodiment, the high-frequency amplifier circuit 30 according to the second embodiment, the high-frequency amplifier circuit 40 according to the third embodiment, or the high-frequency amplifier circuit 60 according to the fourth embodiment described above is used to form a power amplifier of an RF front end unit in a radio communication apparatus, for example, a CDMA-type portable telephone. FIG. 9 is a block diagram showing an example of a configuration of an RF front end unit in a COMA-type portable telephone In FIG. 9, a received wave received by an antenna 71 is passed through a band allocation filter 72 used for both transmission and reception, changed to a certain signal level by an AGC amplifier 73, and then supplied to a mixer 74. The received wave is converted by the mixer 74 into an intermediate frequency (IF) by being mixed with a local oscillation frequency from a local oscillator 75 and then supplied to a baseband IC (not shown) in a succeeding stage.

On the transmitting side, an IF signal supplied from a baseband IC in a preceding stage is supplied to a mixer 76 to be mixed with a local oscillation frequency from a local oscillator 77 and thereby converted into an RF signal. The RF signal is amplified by a power amplifier 78, passed through the band allocation filter 72, and then supplied to the antenna 71 to be transmitted as a radio wave from the antenna 71.

The high-frequency amplifier circuit 10 according to the first embodiment, the high-frequency amplifier circuit 10' according to a modification of the first embodiment, the high-frequency amplifier circuit 30 according to the second embodiment, the high-frequency amplifier circuit 40 adding to the third embodiment, or the high-frequency amplifier circuit 60 according to the fourth embodiment described above is used as the power amplifier 78 on the transmitting side in the thus formed, RF fronted unit of the CDMA-type portable telephone.

Thus, by using the high-frequency amplifier circuits according to the first and second embodiments as the power amplifier 78 on the transmitting side in the RF front-end unit of a portable-type radio communication apparatus required severely to lower current consumption, such as a portable telephone, long communication by a battery is made possible because the high-frequency amplifier circuits can increase the efficiency of the power amplifier at the times of medium and low output power. In particular, since the whole of the control system for controlling the circuit supply voltage of the power amplifier according to input power is included in the power amplifier module, it is possible to obtain the effect of increasing the efficiency of the power amplifier at the times of medium and low output power only by replacing the power amplifier module.

In addition, by using the high-frequency amplifier circuits according to the third and fourth embodiments as the power amplifier 78 on the transmitting side, long communication by a battery is made possible because the high-frequency amplifier circuits can operate at a high efficiency over a wide input dynamic range. In particular, since the whole of the control system for controlling the circuit supply voltage of the power amplifier according to input power is included in the power amplifier module, it is possible to obtain the effect of high-efficiency operation over a wide input dynamic range only by replacing the power amplifier module.

It is to be noted that while the foregoing application example has been described by taking as an example a case where the high-frequency amplifier circuits are applied to a CDMA-type portable telephone, the present invention is not limited to the application example, and it is applicable to radio communication apparatus in general.

As described above, the present invention detects input power, obtains the data of the average value of the input power by averaging the detection output, and reduces the circuit supply voltage of the power amplifier on the basis of the data of the average value at the times of medium and low output power, whereby consumption of a current unnecessarily flowing to the power amplifier can be controlled. It is therefore possible to improve the power adding efficiency of the power amplifier at the times of medium and low output power. In addition, since the control system is formed by a digital circuit, the characteristics of the control system with respect to temperature, secular change, or device variations are not readily degraded. Furthermore, since the whole of the control system is included in the power amplifier module, a current portable-type radio-communication apparatus using a power amplifier module can obtain the effect of the efficiency of the power amplifier at the times of medium and low output power amplifier module is replaced.

What is claimed is:

1. A high-frequency amplifier circuit comprising:
   detecting means for detecting input power said detecting means having a detection output;
   averaging means for averaging the detection output of said detecting means and outputting an averaged detection output as digital data;
   DC-to-DC converting means for converting an externally supplied supply voltage into a predetermined direct-current voltage;
   voltage controlling means for controlling the predetermined direct current voltage of said DC-to-DC converting means based on the averaged detection output of said averaging means; and
   a power amplifier operated by the predetermined direct current voltage of said DC-to-DC converting means for amplifying an input signal and outputting an amplified input signal.

2. A high-frequency amplifier circuit as claimed in claim 1,
   wherein said averaging means comprises an A/D converter for converting the detection output of said detecting means into a digital signal, and a digital low-pass filter for averaging the converted detection output of said the A/D converter.

3. A high-frequency amplifier circuit as claimed in claim 1,
   wherein said averaging moans comprises an analog low-pass filter for averaging the detection output of said detecting means and an A/D converter for converting the averaged detection output of said detecting means into a digital signal.

4. A high-frequency amplifier circuit as claimed in claim 1, further comprising:
   a selector switch for alternatively supplying said DC-to-DC converting means and said power amplifier with the externally supplied supply voltage; and
   switching control means for turning said selector switch to a side of said power amplifier when said direct-current supply voltage exceeds a withstand voltage of said DC-to-DC converting means.

5. A high-frequency amplifier circuit, comprising;
   supply voltage converting means for converting an externally supplied supply voltage to a direct-current voltage corresponding to input power;
   a power amplifier operated by an output voltage of said supply voltage converting means for amplifying an input signal and outputting the amplified input signal; and
   front-disposed distortion-compensating means for generating inverse distortion components of said power amplifier based on said input power and thereby compensating for nonlinear distortion of said power amplifier,
   wherein said supply voltage converting means comprises:
      detecting means for detecting said input power; averaging means for averaging the detection output of said detecting means and outputting the averaged detection output as digital data;
      DC-to-DC converting means for converting the externally supplied supply voltage into a predetermined direct-current voltage and supplying the predetermined direct-current voltage to said power amplifier; and
      voltage controlling means for controlling the predetermined direct current voltage of said DC-to-DC converting means based on the averaged detection output data of said averaging means.

6. A high-frequency amplifier circuit as claimed in claim 5,
   wherein said averaging means comprises an A/D converter for converting the detection output of said detecting means into a digital signal and a digital low-pass filter for averaging the converted detection output of said A/D converter.

7. A high-frequency amplifier circuit as claimed in claim 5,
   wherein said front-disposed distortion-compensating means comprises: detecting means for detecting said input power said detecting means having a detection output; and an A/D converter for converting the detection output of said detecting means into a digital signal; and
   said voltage controlling means has a digital low-pass filter for averaging the converted detection output of said A/D converter, and controls the predetermined direct current voltage of said DC-to-DC converting means based on output data of the digital low-pass filter.

8. A high-frequency amplifier circuit as claimed in claim 5,
   wherein said supply voltage converting means further comprises:
      a selector switch for alternatively supplying said DC-to-DC converting means and said power amplifier with the externally supplied supply voltage; and
      switching control means for turning said selector switch to a side of said power amplifier when said direct-current voltage exceeds a withstand voltage of said DC-to-DC converting means.

9. A radio communication apparatus using, as a power amplifier for forming a front end of a transmitting system thereof, a high-frequency amplifier circuit, the high frequency amplifier circuit comprising:

detecting means for detecting input power said detecting means having a detection output;

averaging means for averaging the detection output of said detecting means and outputting the averaged detection output as digital data, DC-to-DC converting means for converting an externally supplied supply voltage into a predetermined direct-current voltage to provide an output voltage;

voltage controlling means for controlling the output voltage of said DC-to-DC converting means based on the averaged detection output of said averaging means; and a power amplifier by the output voltage of said DC-to-DC converting means for amplifying an input signal and outputting the amplified input signal.

10. A radio communication apparatus as claimed in claim 9, wherein said high-frequency amplifier circuit further comprises: a selector switch for alternatively supplying said DC-to-DC converting means and said power amplifier with the externally supplied supply voltage; and a switching control means for turning said selector switch to a side of said power amplifier when said direct-current supply voltage exceeds a withstand voltage of said DC-to-DC converting means.

11. A radio communication apparatus using as a power amplifier for forming a front end of a transmitting system thereof, a high-frequency amplifier circuit comprising:

supply voltage converting means for converting an externally supplied direct-current supply voltage to a direct-current voltage corresponding to input power;

a power amplifier operated by an output voltage of said supply voltage converting means for amplifying an input signal and outputting the amplified input signal; and front-disposed distortion-compensating means for generating inverse distortion components of said power amplifier based on said input power and thereby compensating for nonlinear distortion of said power amplifier, wherein said supply voltage converting means comprises:

detecting means for detecting said input power said detecting means having a detection output;

averaging means for averaging the detection output of said detecting means and outputting the averaged detection output as digital data;

DC-to-DC converting means for converting the externally supplied supply voltage into the predetermined direct-current voltage and supplying the direct-current voltage to said power amplifier; and voltage controlling means for controlling the output voltage of said DC-to-DC converting means based on the output data of said averaging means.

12. A radio communication apparatus as claimed in claim 11, wherein said supply voltage converting means further comprises:

a selector switch for alternatively supplying said DC-to-DC converting means and said power amplifier with the externally supplied supply voltage; and switching control means for turning said selector switch to a side of said power amplifier when said direct-current supply voltage exceeds a withstand voltage of said DC-to-DC converting means.

* * * * *

UNITED STATES PATENT AND TRADEMARK OFFICE
CERTIFICATE OF CORRECTION

PATENT NO. : 6,741,127 B2
DATED : May 25, 2004
INVENTOR(S) : Noboru Sasho

It is certified that error appears in the above-identified patent and that said Letters Patent is hereby corrected as shown below:

<u>Title page,</u>
Item [57], ABSTRACT,
Line 8, "vdd" should read -- Vdd --.

<u>Column 15,</u>
Line 58, "moans" should read -- means --.

Signed and Sealed this

First Day of November, 2005

JON W. DUDAS
*Director of the United States Patent and Trademark Office*